United States Patent [19]

Ninomiya et al.

[11] Patent Number: 5,208,783
[45] Date of Patent: *May 4, 1993

[54] MEMORY UNIT DELAY-COMPENSATING CIRCUIT

[75] Inventors: Kazuki Ninomiya; Seiji Yamaguchi, both of Osaka, Japan

[73] Assignee: Matsushita Electric Industrial Co., Ltd., Japan

[*] Notice: The portion of the term of this patent subsequent to Oct. 1, 2008 has been disclaimed.

[21] Appl. No.: 684,735

[22] Filed: Apr. 15, 1991

Related U.S. Application Data

[63] Continuation of Ser. No. 331,784, Apr. 3, 1989, Pat. No. 5,054,002.

[30] Foreign Application Priority Data

Apr. 5, 1988 [JP] Japan .................................. 63-83305

[51] Int. Cl.⁵ .............................................. G11G 7/04
[52] U.S. Cl. .................................... 365/233; 365/211; 365/212
[58] Field of Search ........... 365/194, 212, 233, 230.06, 365/211; 307/480, 590, 591, 600, 601, 602; 328/62

[56] References Cited

U.S. PATENT DOCUMENTS

| | | | |
|---|---|---|---|
| 4,162,540 | 7/1979 | Ando | 365/194 |
| 4,905,192 | 2/1990 | Nogami et al. | 365/194 |
| 4,918,657 | 4/1990 | Takahashi | 365/233 |

*Primary Examiner*—Joseph L. Dixon
*Assistant Examiner*—Jack A. Lane
*Attorney, Agent, or Firm*—Lowe, Price, LeBlanc & Becker

[57] ABSTRACT

A memory unit includes an array of memory cells. Word lines are connected to the memory cells. Bit lines are connected to the memory cells. A decoder receives an address signal at a timing which follows an occurrence of a clock signal by a given time t1. The address signal is in synchronism with the clock signal. The clock signal has a preset period t0. The decoder decodes the address signal into a word signal and outputs the word signal at a timing which follows the reception of the address signal by a given time t2. A delay device delays the clock signal by a preset time "t" and thereby converts the clock signal into a control signal. An access to a word of the memory cells is performed via one of the word lines in accordance with the word signal at a timing determined by the control signal. The bit lines are precharged at a timing determined by the control signal. The preset time "t" is longer than a sum of the times t1 and t2 but shorter than a half of the period t0.

28 Claims, 5 Drawing Sheets

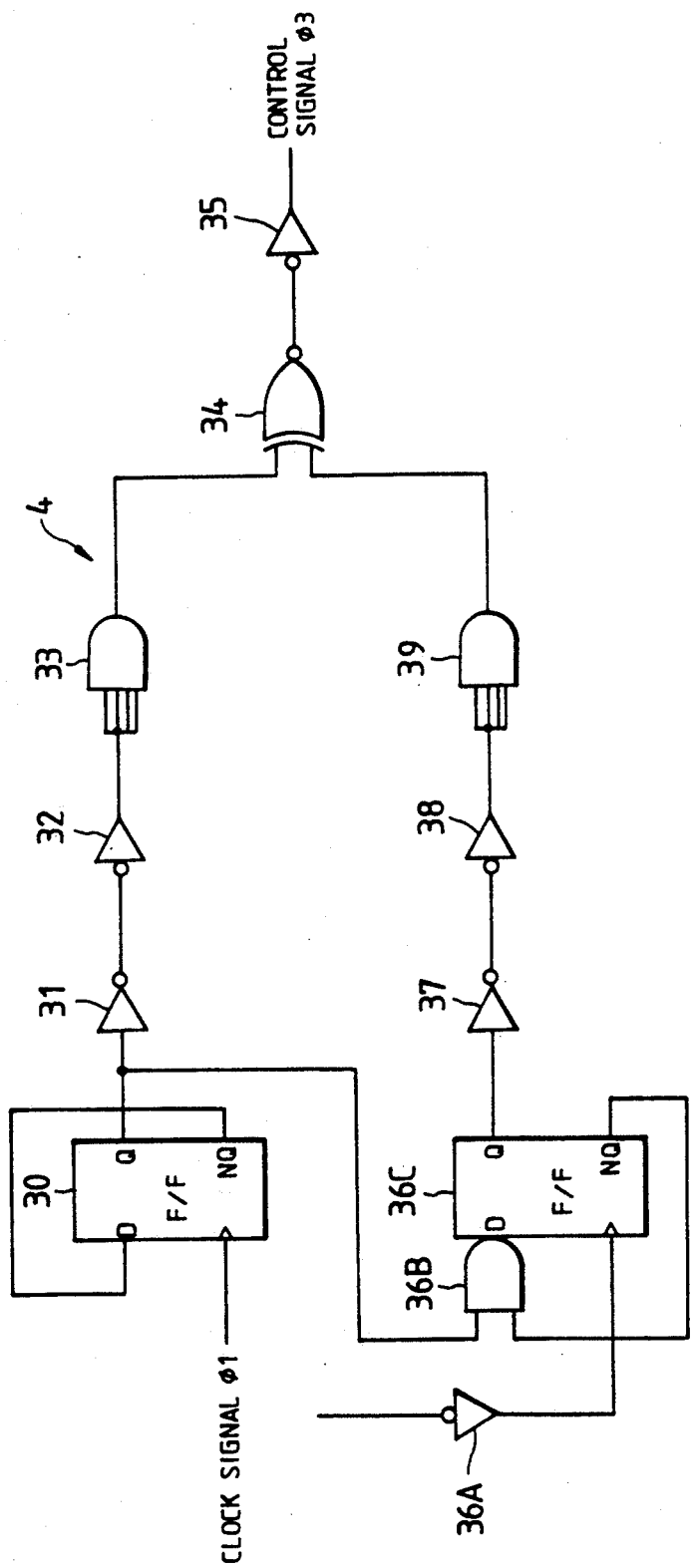
FIG. 5
FIG. 6

MEMORY UNIT DELAY-COMPENSATING CIRCUIT

This application is a continuation of Application Ser. No. 07/331,784 filed Apr. 3, 1989, U.S. Pat. No. 5,054,002.

BACKGROUND OF THE INVENTION

This invention relates to a memory unit usable in various devices such as a microprocessor.

Microprocessors generally include a memory unit. It is desirable to speed up the data readout from such a memory unit. The speed-up in the data readout increases the processing ability of the related microprocessor.

SUMMARY OF THE INVENTION

It is an object of this invention to provide a memory unit which allows a high speed of data readout.

A first memory unit of this invention includes an array of memory cells. Word lines are connected to the memory cells. Bit lines are connected to the memory cells. A decoder receives an address signal at a timing which follows an occurrence of a clock signal by a given time t1. The address signal is in synchronism with the clock signal. The clock signal has a preset period t0. The decoder decodes the address signal into a word signal and outputs the word signal at a timing which follows a timing of the reception of the address signal by a given time t2. A delay device delays the clock signal by a preset time "t" and thereby converts the clock signal into a control signal. An access to a word of the memory cells is performed via one of the word lines in accordance with the word signal at a timing determined by the control signal. The bit lines are precharged at a timing determined by the control signal. The preset time "t" is longer than a sum of the times t1 and t2 but shorter than a half of the period t0.

A second memory unit of this invention includes an array of memory cells. Word lines are connected to the memory cells. A decoder receives an address signal at a timing which follows an occurrence of a clock signal by a given time t1. The address signal is in synchronism with the clock signal. The clock signal has a preset period t0. The decoder decodes the address signal into a word signal and outputs the word signal at a timing which follows the reception of the address signal by a given time t2. A delay device delays the clock signal by a preset time "t" and thereby converts the clock signal into a control signal. An access to a word of the memory cells is performed via one of the word lines in accordance with the word signal at a timing determined by the control signal. The preset time "t" is longer than a sum of the times t1 and t2 but shorter than a half of the period t0.

BRIEF DESCRIPTION OF THE DRAWINGS

FIG. 5 is a block diagram of the control signal generator of FIG. 3.

FIG. 6 is a block diagram of a control signal generator in a memory unit according to a second embodiment of this invention.

BRIEF DESCRIPTION OF THE PREFERRED EMBODIMENTS

Before the description of embodiments of this invention, a prior art memory unit will be described for a better understanding of this invention.

Figure 1:
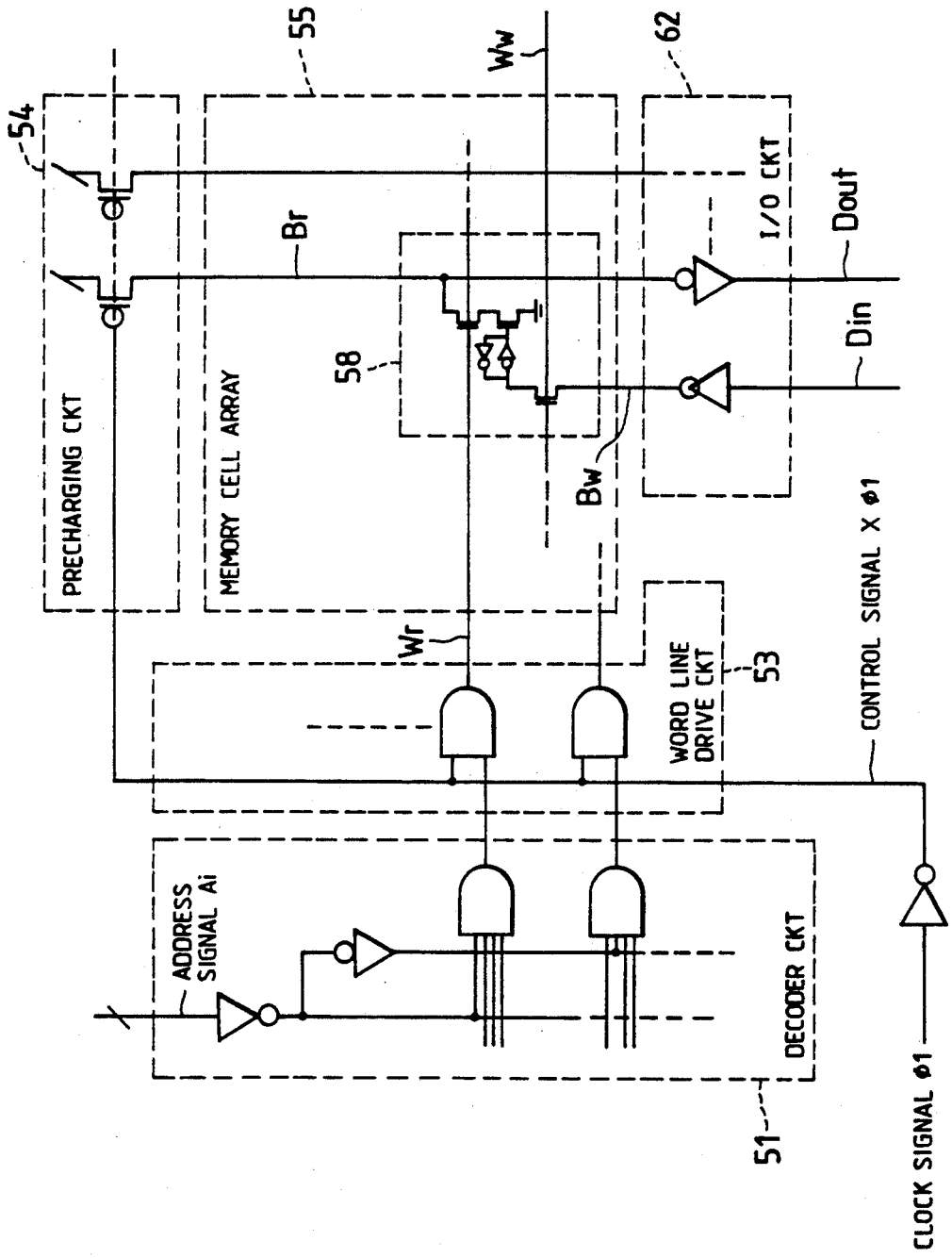
FIG. 1 is a block diagram of a prior art memory unit.

FIG. 1 shows a prior art memory unit in a microprocessor. As shown in FIG. 1, the prior art memory unit includes a decoder circuit 51, a word line drive circuit 53, a memory cell array 55 of n-words by m-bits, a precharging circuit 54, and an input/output buffer circuit 62. The characters "m" and "n" denote preset natural numbers.

The prior art memory unit of FIG. 1 operates as follows. During a data readout mode of operation of the prior art memory unit, an address signal Ai is inputted into the decoder circuit 51. The address signal Ai has k-bits A1, A2, ..., Ak. The character "k" denotes a preset natural number. The decoder circuit 51 determines one word in accordance with the input address signal. The determined word is selected from an n-number of words. An n-number of output signals from the decoder circuit 51 are applied to the word line drive circuit 53. The decoder circuit 51 selects one word line Wr through the word line drive circuit 53 in accordance with the input address signal. An inverter (no reference character) converts a clock signal $\phi 1$ into a control signal $X\phi 1$ which is fed to the word line drive circuit 53 and the precharging circuit 54. When the control signal $X\phi 1$ assumes a low level, the circuit 54 precharges an m-number of bit lines Br. The word line drive circuit 53 activates the selected word line Wr in response to the control signal $X\phi 1$. As a result, one word of memory cells 58 connected to the activated word line Wr is selected, and the data are transferred from these memory cells 58 to the bit lines Br and are further transmitted to output lines Dout via the input/output buffer circuit 62.

During the data readout mode of operation of the prior art memory unit of FIG. 1, when the clock signal $\phi 1$ assumes a high level, the address signal Ai is inputted into the decoder circuit 51 and the address of a word to be selected is determined by the decoder circuit 51 in accordance with the input address signal. In addition, when the clock signal $\phi 1$ assumes the high level, the precharging circuit 54 is activated by the control signal $X\phi 1$ so that the bit lines Br are precharged by the circuit 54 in preparation for a main part of the data readout process. When the clock signal $\phi 1$ changes from the high level to a low level, the word line Wr corresponding to the selected word is activated so that the data are read out from the related memory cells 58.

Figure 2:
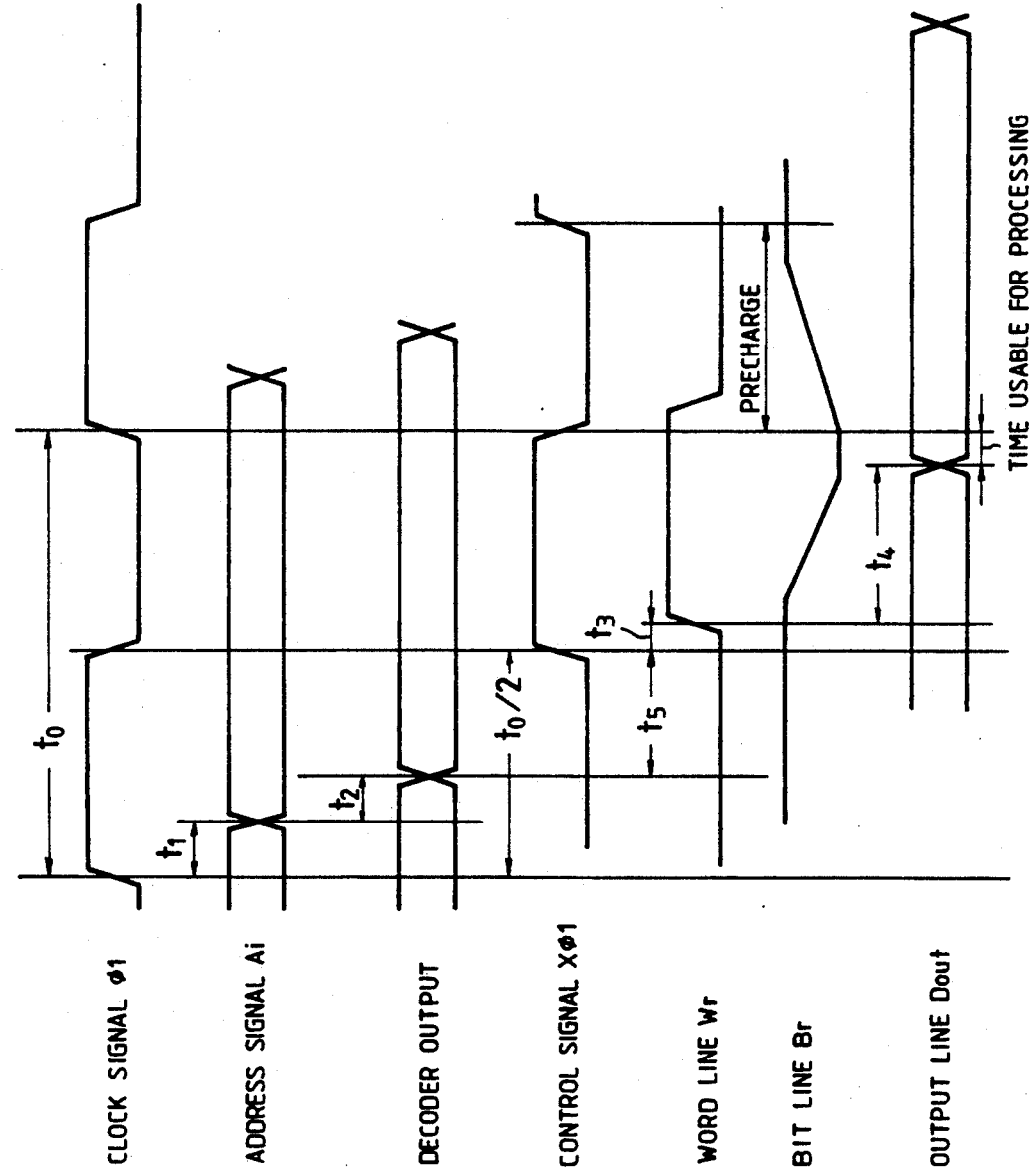
FIG. 2 is a timing diagram of various signals in the prior art memory unit of FIG. 1.

The data readout mode of operation of the prior art memory unit of FIG. 1 will be further described with reference to FIG. 2. As shown in FIG. 2, when a time t1 elapses since the moment of the change of the clock signal $\phi 1$ from the low level to the high level, the address signal Ai is inputted into the decoder circuit 51. The decoder circuit 51 outputs the signals to the word line drive circuit 53 at a moment which follows the moment of the inputting of the address signal Ai by a time t2 spent in the address signal decoding process. While the clock signal $\phi 1$ remains at the high level, that is, while the control signal $X\phi 1$ remains at the low level, the precharging circuit 54 is activated so that the bit lines Br are precharged. After a time t5 elapses following the moment of outputting of the signals from the decoder circuit 51 to the word line drive circuit 53, the control signal Xφ1 changes from the low level to the high level. The word line Wr corresponding to the selected word is activated by the word line drive circuit 53 at a moment which follows the moment of the change of the control signal Xφ1 to the high level by a time t3. The activation of the word line Wr allows the access to the memory cells 58 of the selected word. As a result, the data are outputted from the memory cells 58 of the selected word to the bit lines Br. When a time t4 elapses after the moment of activation of the word line Wr, the data are further transmitted to the output lines Dout via the input/output buffer circuit 62. The clock signal φ1 changes from the low level to the high level at a moment which follows the transmission of the data to the output lines Dout by a predetermined time.

In the prior art memory unit of FIG. 1, during the data readout mode of operation, while the clock signal φ1 remains at the high level, the inputting and decoding of the address signal Ai and the precharging of the bit lines Br are performed as described previously. In addition, while the clock signal φ1 remains at the low level, the data transfer from the memory cells 58 to the output lines Dout is performed as described previously. As understood from FIG. 2, the sum of the times t5 and t3 is spent between the moment of the determination of the output signals from the decoder circuit 51 and the moment of the activation of the word line Wr. The spent time tends to be lengthy and generally causes a considerable slowdown of the data readout process of the memory unit.

The prior art memory unit of FIG. 1 also has a similar slowdown problem during a write mode of operation. The prior art memory unit includes a write decoder circuit and a write word line drive circuit having designs similar to those of the decoder circuit 51 and the word line drive circuit 53. During the write mode of operation of the prior art memory unit of FIG. 1, a combination of the write decoder circuit and the write word line drive circuit selects and activates a word line Ww in accordance with an input address signal. Data inputted via input lines Din are written into memory cells 58 of the selected word via the input/output buffer circuit 62 and write bit lines Bw.

As will be made clear hereafter, a memory unit of this invention allows a shorter time spent between the moment of the determination of output signals from a decoder circuit and the moment of the activation of a word line and thereby enables a higher speed of a data readout process.

Figure 3:
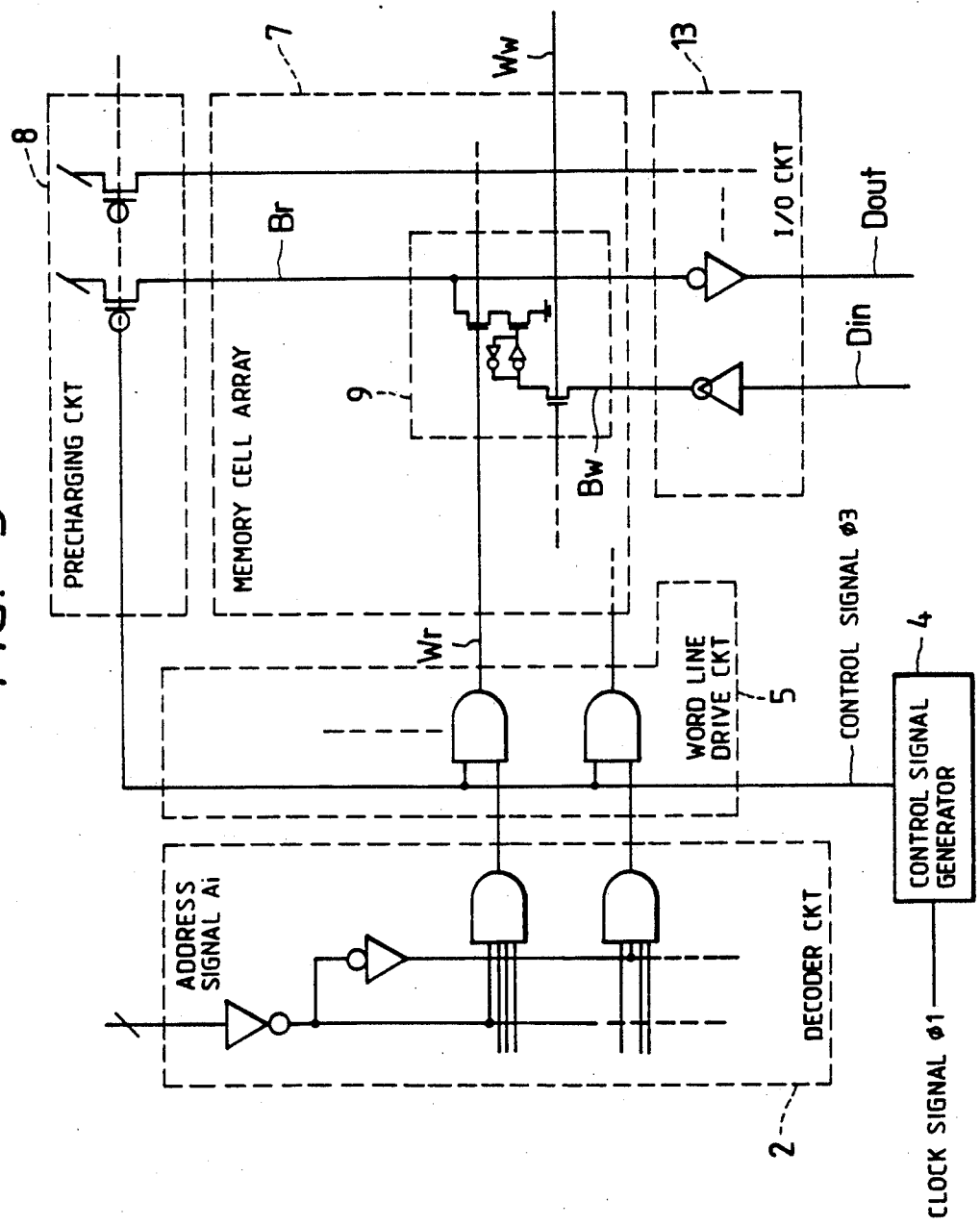
FIG. 3 is a block diagram of a memory unit according to a first embodiment of this invention.

Embodiments of this invention will now be described. FIG. 3 shows a memory unit according to a first embodiment of this invention. As shown in FIG. 3, the memory unit of this invention includes a decoder circuit 2, a word line drive circuit 5, a memory cell array 7 of n-word by m-bit, a precharging circuit 8, an input/output buffer circuit 13, and a control signal generator 4. The characters "m" and "n" denote preset natural numbers.

The memory cell array 7 includes two-dimensionally arranged memory cells 9 which are connected to an n-number of word lines Wr and an m-number of bit lines Br in a known way. The word lines Wr are connected to the word line drive circuit 5. The bit lines Br are connected to the precharging circuit 8 and the input/output buffer circuit 13.

A k-bit address signal Ai is inputted into the decoder circuit 2. The address signal Ai has k-bits A1, A2, ..., Ak. The character "k" denotes a preset natural number which has the relationship with the number "n" as "$2^k \geq n$". The decoder circuit 2 determines one word in accordance with the input address signal Ai. The determined word is selected from an n-number of words. An n-number of output signals from the decoder circuit 2 are applied to the word line drive circuit 5. The decoder circuit 2 selects one word line Wr through the word line drive circuit 5 in accordance with the input address signal Ai.

The control signal generator 4 receives a clock signal φ1 having a given period t0 and generates a control signal φ3 by delaying the clock signal φ1 by a predetermined time "t". The control signal φ3 is fed to the word line drive circuit 5 and the precharging circuit 8. When the control signal φ3 assumes a low level, the precharging circuit 8 precharges the bit lines Br. The word line drive circuit 5 activates the selected word line Wr in response to the control signal φ3. As a result, one word of memory cells 9 connected to the activated word line Wr is selected, and the data are transferred from these memory cells 9 to the bit lines Br and are further transmitted to output lines Dout via the input/output buffer circuit 13.

The delay time "t" is chosen to satisfy the relationship as "$t1+t2<t<t0/2$", where the character t1 denotes a delay time of the address signal A1 with respect to the clock signal φ1 and the character t2 denotes a delay time of the decoder circuit 2. In other words, the delay time "t" is longer than the sum of the times t1 and t2 but shorter than a half of the period t0 of the clock signal φ1.

Operation of the memory unit of FIG. 3 will be described with reference to FIG. 4. During a data readout mode of operation of the memory unit of FIG. 3, the address signal Ai is inputted into the decoder circuit 2 at a timing which follows the timing of the change of the clock signal φ1 from a low level to a high level by the given time t1. The output signals from the decoder circuit 2 to the word line drive circuit 5 select one word line Wr in accordance with the address signal Ai. The clock signal φ1 has the period t0. When a time t2 elapses after the moment of inputting of the address signal Ai into the decoder circuit 2, the decoder circuit 2 outputs signals to the word line drive circuit 5. The clock signal φ1 is inputted into the control signal generator 4. The control signal generator 4 generates the control signal φ3 which follows the clock signal φ1 by the predetermined time "t". The predetermined time "t" is chosen to satisfy the relationship as "$t1+t2<t<t0/2$". The control signal φ3 is fed to the word line drive circuit 5 and the precharging circuit 8. When the control signal φ3 assumes a low level, the precharging circuit 8 precharges the bit lines Br. The word drive circuit 5 activates the selected word line Wr in response to the control signal φ3. Specifically, the moment of the activation of the selected word line Wr follows the moment of the change of the control signal φ3 from a low level to a high level by a time t3. The activation of the word line Wr allows the access to the memory cells 9 of the selected word. As a result, the data are outputted from the memory cells 9 of the selected word to the bit lines Br. When a time t4 elapses since the moment of the activation of the word line Wr, the data are further transmitted to the output lines Dout via the input/output buffer circuit 13. The clock signal φ1 changes from the low level to the high level at a moment which follows the transmission of the data to the output lines Dout by a given time t6. The time t6 can be spent for the processing of the readout data which is generally executed by the processing section of a microprocessor.

Figure 4:
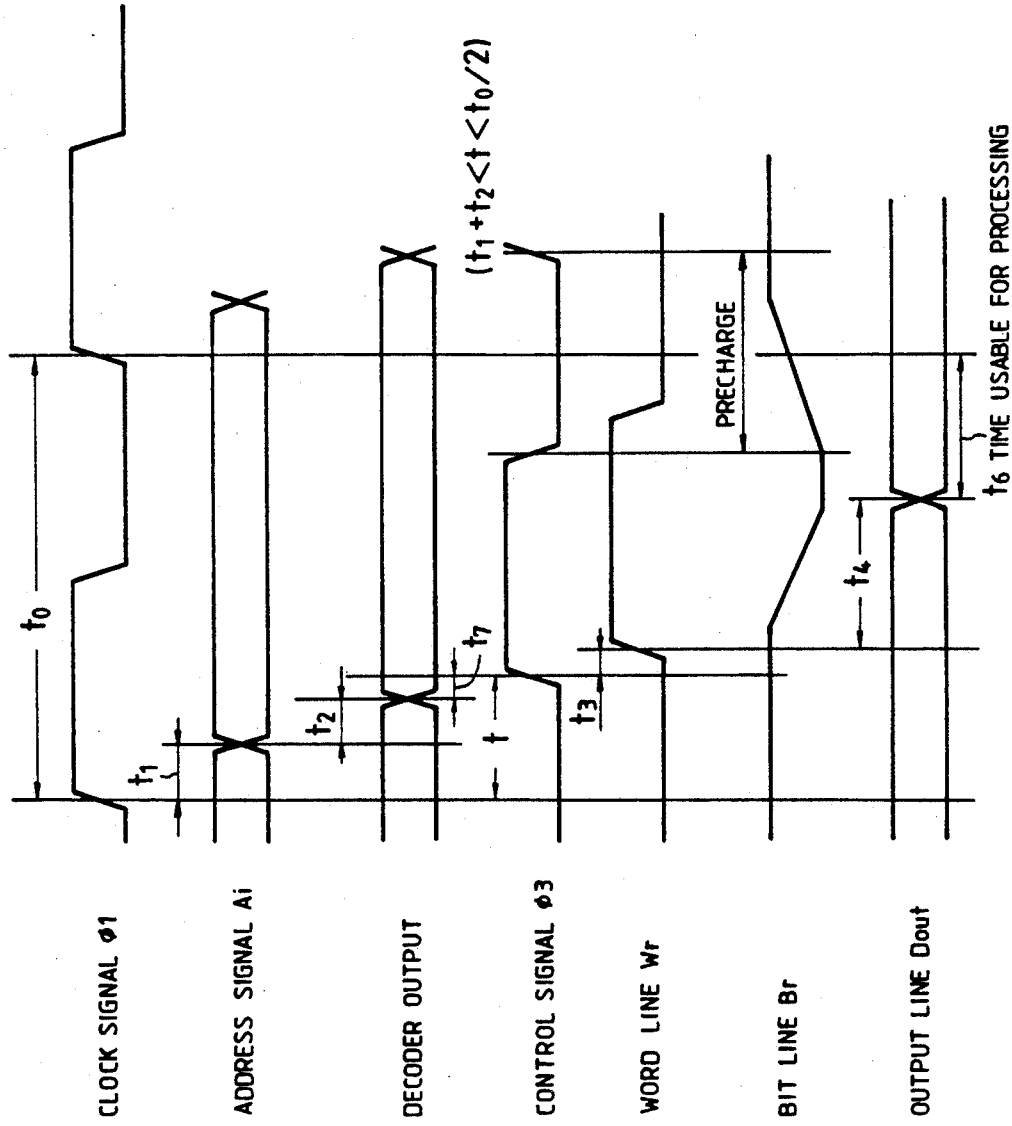
FIG. 4 is a timing diagram of various signals in the memory unit of FIG. 3.

As understood from the comparison between FIGS. 2 and 4, the memory unit of FIG. 3 allows a shorter time t7 to be spent between the moment of the determination of the output signals from the decoder circuit 2 and the moment of the activation of the selected word line Wr. Accordingly, it is possible to obtain a higher speed of the data readout process and a longer time spent for the processing of the readout data.

The memory unit of FIG. 3 also has a similar advantage during a write mode of operation. The memory unit of FIG. 3 includes a write decoder circuit (not shown) and a write word line drive circuit (not shown) having designs similar to those of the decoder circuit 2 and the word line drive circuit 5. During the write mode of operation of the memory unit of FIG. 3, a combination of the write decoder circuit and the write word line drive circuit selects and activates a word line Ww in accordance with an input address signal. Data inputted via input lines Din are written into memory cells 58 of the selected word via the input/output buffer circuit 13 and write bit lines Bw.

As shown in FIG. 5, the control signal generator 4 includes a D flip-flop (F/F) 30 whose clock input terminal is subjected to the clock signal $\phi 1$. The input terminal D of the flip-flop 30 is connected to an inverted output terminal NQ of the flip-flop 30. The non-inverted output terminal Q of the flip-flop 30 is connected to a first input terminal of an exclusive OR gate 34 via a series combination of inverters 31 and 32, and a gate 33. The non-inverted output terminal Q of the flip-flop 30 is also connected to the input terminal D of another D flip-flop 36C via an AND gate 36B. The clock signal $\phi 1$ is applied to the clock input terminal of the flip-flop 36C via an inverter 36A. The inverted output terminal NQ of the flip-flop 36C is connected to the input terminal D of the flip-flop 36C via the gate 36B. The non-inverted output terminal of the flip-flop 36C is connected to a second input terminal of the gate 34 via a series combination of inverters 37 and 38, and a gate 39. The output terminal of the gate 34 is connected to the input terminal of an inverter 35. The control signal $\phi 3$ appears at the output terminal of the inverter 35.

In general, the delay time interval t1 between the moment of the change of the clock signal $\phi 1$ to the high level and the moment of the inputting of the address signal Ai into the decoder circuit 2 is caused by flip-flops within an address signal output circuit (not shown) which latch an original address signal in response to the clock signal $\phi 1$. In view of this fact, the flip-flop 30 is designed to perform a similar latching process to delay the clock signal $\phi 1$ by a time equal to the delay time t1. The design using the flip-flop 30 compensates for a variation in the delay time t1 which would be caused by various factors such as a variation in the temperature of the related circuit elements or a fluctuation in the voltage applied to the related circuit elements. The combination of the devices 31-33 is designed in a manner similar to the design of a section of the decoder circuit 2 which causes the delay time t2. Accordingly, the combination of the devices 31-33 functions to delay the output signal from the flip-flop 30 by a time equal to the delay time t2. The design similarity between the combination of the devices 31-33 and the section of the decoder circuit 2 compensates for a variation in the delay time t2 which would be caused by various factors such as a variation in the temperature of the related circuit elements or a fluctuation in the voltage applied to the related circuit elements.

The frequency of the output signal from the flip-flop 30 is half the frequency of the clock signal $\phi 1$. Accordingly, the frequency of the signal which is outputted from the gate 33 to the gate 34 is also half the frequency of the clock signal $\phi 1$. The combination of the devices 36A-39 functions to generate a signal which is 90° out of phase with respect to the output signal from the gate 33. The signal which is generated by the combination of the devices 36A-39 is fed to the gate 34. Accordingly, the gate 34 outputs a signal whose frequency is equal to the frequency of the clock signal $\phi 1$. The combination of the devices 34 and 35 functions to delay the moment of the change of the control signal $\phi 3$ to the high level with respect to the moment of the outputting of the signals from the decoder circuit 2 by a given time t7 (see FIG. 4).

FIG. 6 shows a second embodiment of this invention which is similar to the embodiment of FIGS. 3-5 except for a control signal generator. In the embodiment of FIG. 6, a control signal generator 4A includes a series combination of inverters 20-23 which is designed to delay a clock signal $\phi 1$ by a predetermined time "t" to obtain a control signal $\phi 3$.

It should be noted that this invention may be applied to other memories such as a random access memory (RAM) or a read only memory (ROM) composed of transistors.

What is claimed is:
1. A memory unit comprising:
an array of memory cells which has a capacity of n-words by m-bits where the characters "m" and "n" denote preset natural numbers;
word lines connected to the memory cells;
bit lines connected to the memory cells;
a decoder receiving an address signal at a timing which follows a timing of an occurrence of a clock signal by a given time t1, the address signal being in synchronism with the clock signal and having k-bits where the character "k" denotes a preset natural number which satisfies a relationship as "$2^k \geq n$", the clock signal having a preset period t0, the decoder decoding the address signal into a word signal and outputting the word signal at a timing which follows a timing of the reception of the address signal by a given time t2;
delaying means for delaying the clock signal by a preset time "t" and thereby converting the clock signal into a control signal;
means for performing an access to a word of the memory cells via one of the word lines in accordance with the word signal at a timing determined by the control signal; and
means for precharging the bit lines at a timing determined by the control signal;
wherein the preset time "t" is longer than a sum of the times t1 and t2 but shorter than a half of the period t0, and wherein the delaying means includes a delay causing component substantially identical in structure to a part of the decoder causing variation in the time t2, thereby to adjust the time "t" to compensate for the variation of the time t2.

2. The memory unit of claim 1, wherein said delay causing component includes means for increasing the time "t" to compensate for increases in the time t2 and for decreasing the time "t" to compensate for decreases in the time t2.

3. The memory circuit of claim 1, wherein said delaying means comprises means for time-shifting both leading and trailing edges of said clock signal by said preset time period "t".

4. A memory unit comprising:
an array of memory cells;
word lines connected to the memory cells;
bit lines connected to the memory cells;
a decoder receiving an address signal at a timing which follows a timing of an occurrence of a clock signal by a given time t1, the address signal being in synchronism with the clock signal, the clock signal having a preset period t0, the decoder decoding the address signal into a word signal and outputting the word signal at a timing which follows a timing of the reception of the address signal by a given time t2;
delaying means for delaying the clock signal by a preset time "t" and thereby converting the clock signal into a control signal;
means for performing an access to a word of the memory cells via one of the word lines in accordance with the word signal at a timing determined by the control signal; and
means for precharging the bit lines at a timing determined by the control signal;
wherein the preset time "t" is longer than a sum of the times t1 and t2 but shorter than a half of the period t0, and wherein the delaying means includes a delay causing component substantially identical in structure to a part of the decoder causing variation in the time t2, thereby to adjust the time "t" to compensate for the variation of the time t2.

5. The memory unit of claim 4, wherein said delay causing component includes means for increasing the time "t" to compensate for increases in the time t2 and for decreasing the time "t" to compensate for decreases in the time t2.

6. A memory unit comprising:
an array of memory cells;
word lines connected to the memory cells;
a decoder receiving an address signal at a timing which follows a timing of an occurrence of a clock signal by a given time t1, the address signal being in synchronism with the clock signal, the clock signal having a preset period t0, the decoder decoding the address signal into a word signal and outputting the word signal at a timing which follows a timing of the reception of the address signal by a given time t2;
delaying means for delaying the clock signal by a preset time "t" and thereby converting the clock signal into a control signal; and
means for performing an access to a word of the memory cells via one of the word lines in accordance with the word signal at a timing determined by the control signal;
wherein the preset time "t" is longer than a sum of the times t1 and t2 but shorter than a half of the period t0, and wherein the delaying means includes a delay causing component substantially identical in structure to a part of the decoder causing variation in the time t2, thereby to adjust the time "t" to compensate for the variation of the time t2.

7. A memory unit comprising:
an array of memory cells which has a capacity of n-words by m-bits where the characters "m" and "n" denote preset natural numbers;
word lines connected to the memory cells;
bit lines connected to the memory cells;
a decoder receiving an address signal at a timing which follows a timing of an occurrence of a clock signal by a given time t1, the address signal being in synchronism with the clock signal and having k-bits where the character "k" denotes a preset natural number which satisfies a relationship as "$2^k \geq n$", the clock signal having a preset period t0, the decoder decoding the address signal into a word signal and outputting the word signal at a timing which follows a timing of the reception of the address signal by a given time t2 exposed to variation;
delaying means for delaying the clock signal by a preset time "t" and thereby converting the clock signal into a control signal;
means for performing an access to a word of the memory cells via one of the word lines in accordance with the word signal at a timing determined by the control signal; and
means for precharging the bit lines at a timing determined by the control signal;
wherein the preset time "t" is longer than a sum of the times t1 and t2 but shorter than a half of the period t0, and wherein the delaying means comprises means for adjusting the time "t" in accordance with the variation of the time t2 thereby to compensate for the variation of the time t2.

8. The memory unit of claim 7, wherein said delay causing component includes means for increasing the time "t" to compensate for increases in the time t2 and for decreasing the time "t" compensate for decreases in the time t2.

9. The memory circuit of claim 7, wherein said delaying means comprises means for time-shifting both leading and trailing edges of said clock signal by said preset time period "t".

10. A memory unit comprising:
an array of memory cells;
word lines connected to the memory cells;
bit lines connected to the memory cells;
a decoder receiving an address signal at a timing which follows a timing of an occurrence of a clock signal by a given time t1, the address signal being in synchronism with the clock signal, the clock signal having a preset period t0, the decoder decoding the address signal into a word signal and outputting the word signal at a timing which follows a timing of the reception of the address signal by a given time t2 exposed to variation;
delaying means for delaying the clock signal by a preset time "t" and thereby converting the clock signal into a control signal;
means for performing an access to a word of the memory cells via one of the word lines in accordance with the word signal at a timing determined by the control signal; and
means for precharging the bit lines at a timing determined by the control signal;
wherein the preset time "t" is longer than a sum of the times t1 and t2 but shorter than a half of the period t0, and wherein the delaying means comprises means for the adjusting the time "t" in accordance with the variation of the time t2 thereby to compensate for the variation of the time t2.

11. A memory unit comprising:

an array of memory cells;

work lines connected to the memory cells;

a decoder receiving an address signal at a timing which follows a timing of an occurrence of a clock signal by a given time t1, the address signal being in synchronism with the clock signal, the clock signal having a preset period t0, the decoder decoding the address signal into a word signal and outputting the word signal at a timing which follows a timing of the reception of the address signal by a given time t2 exposed to an variation;

delaying means for delaying the clock signal by a preset time "t" and thereby converting the clock signal into a control signal; and means for performing an access to a word of the memory cells via one of the word lines in accordance with the word signal at a timing determined by the control signal;

wherein the preset time "t" is longer than a sum of the times t1 and t2 but shorter than a half of the period t0, and wherein the delaying means comprises means for adjusting the time "t" in accordance with the variation of the time t2 thereby to compensate for the variation of the time t2.

12. In a memory unit including an array of memory cells;

a plurality of word lines connected to the memory cells;

a decoder receiving an address signal at a timing which follows a timing of an occurrence of a clock signal by a given time t1, the address signal being in synchronism with the clock signal, the clock signal having a preset period t0, the decoder decoding the address signal into a word signal and outputting the word signal at a timing which follows a timing of the reception of the address signal by a given time t2;

access means for performing an access to a word of the memory cells via one of the word lines in accordance with the word signal at a timing determined by the control signal, and a control circuit for controlling timing of activating a selected one of said word lines, the improvement comprising:

generating means for generating a control signal for activating said access means, said generating means including timing means for providing a transition in said control signal at a time different by a preset time "t" for a corresponding transition in said clock signal, wherein the preset time "t" is longer than a sum of the times t1 and t2 but shorter than a half of the period t0, thereby to speed up activation of the selected work line and transfer of data.

13. A memory unit as recited in claim 12 wherein said timing means comprises delaying means for delaying the clock signal by said preset time "t" and thereby converting the clock signal into said control signal.

14. The memory circuit of claim 13, wherein said means for delaying comprises means for time-shifting both leading and trailing edges of said clock signal by said preset time period "t".

15. A memory unit as recited in claim 12 wherein said time t2 is subjected to variation and said timing means comprises means for adjusting the time "t" in accordance with the variation of the time t2 thereby to compensate for the variation of the time t2.

16. The memory unit of claim 15, wherein said means for adjusting includes means for increasing the time "t" to compensate for increases in the time t2 and for decreasing the time "t" to compensate for decreases in the time t2.

17. A memory unit as recited in claim 12 wherein said generating means includes means for using said clock signal to generate said control signal.

18. A memory unit as recited in claim 17 wherein said timing means comprises means for delaying the clock signal by said preset time "t" and thereby converting the clock signal into said control signal.

19. The memory unit as recited in claim 17 wherein said timing means comprises a logic circuit including interconnected flip flops and logic gates responsive to outputs thereof for delaying the clock signal by said preset time "t" and thereby converting the clock signal into said control signal.

20. A memory unit as recited in claim 12 wherein said time t1 is subjected to variation in an address circuit generating said address signal and said timing means comprises compensating means for adjusting the time "t" in accordance with the variation of the time t1 thereby to compensate for the variation of the time t1.

21. A memory unit as recited in claim 20 wherein said compensating means comprises flip-flop means corresponding to a similar flip-flop means causing said variation of said time t1 in the address circuit thereby to compensate for variations in said time t1 caused by variation in a temperature of the similar flip-flop means and by fluctuation in a voltage applied to the similar flip-flop means.

22. A memory unit as recited in claim 21 wherein said time t2 is subjected to variation in said decoder and said compensating means further comprises second means for adjusting the time "t" in accordance with the variation of the time t2 thereby to compensate for the variation of the time t2 in said decoder.

23. A memory unit as recited in claim 22 wherein said second means comprises logic means corresponding to similar logic means producing said variation of said time t2 in said decoder thereby to compensate for variations in said time t2 caused by variation in a temperature of the similar logic means and by fluctuation in a voltage applied to the similar logic means.

24. The memory unit of claim 20, wherein said compensating means includes means for increasing the time "t" to compensate for increases in the time t2 and for decreasing the time "t" to compensate for decreases in the time t2.

25. A memory unit for use in combination with an address signal output circuit which latches an original address signal in response to the clock signal, the memory unit comprising:

an array of memory cells which has a capacity of n-words by m-bits where the characters "m" and "n" denote preset natural numbers;

word lines connected to the memory cells;

bit lines connected to the memory cells;

a decoder receiving an address signal from the address signal output circuit at a timing which follows a timing of an occurrence of a clock signal by a given time t1 which is determined by a signal delay time in the address signal output circuit, the address signal being in synchronism with the clock signal and having k-bits where the character "k" denotes a preset natural number which satisfies a relationship as "$2^k \geq n$", the clock signal having a preset period t0, the decoder decoding the address signal into a word signal and outputting the word signal at a timing which follows a timing of the reception of the address signal by a given time t2;

delaying means for delaying the clock signal by a preset time "t" thereby converting the clock signal into a control signal;

means for performing an access to a word of the memory cells via one of the word lines in accordance with the word signal at a timing determined by the control signal; and means for precharging the bit lines at a timing determined by the control signal;

wherein the preset time "t" is longer than a sum of the times t1 and t2 but shorter than a half of the period t0, wherein the delaying means comprises a first delay causing circuit portion and a second delay causing circuit portion, wherein the first delay causing circuit portion of the delaying means has a substantially identical structure to a third circuit portion of the decoder for adjusting the time "t" in accordance with variation of the time t2 caused by the third circuit portion, thereby to compensate for the variation of the time t2, and wherein the second delay causing circuit portion of the delaying means has a substantially identical structure to a fourth circuit portion of the address signal output circuit for adjusting the time "t" in accordance with an variation of the time t1 caused by the fourth circuit portion, thereby to compensate for the variation of the time t1.

26. The memory unit of claim 25 wherein said first delay causing circuit portion and said third circuit portion have substantially identical physical structures, and wherein said second delay causing circuit portion and said fourth circuit portion have substantially identical circuit element.

27. The memory unit of claim 25, wherein said first delay causing circuit portion includes means for increasing the time "t" to compensate for increases in the time t2 and for decreasing the time "t" to compensate for decreases in the time t2, and wherein said second delay causing circuit portion includes means for increasing the time "t" to compensate for increases in the time t1 and for decreasing the time "t" to compensate for decreases in the time t1.

28. The memory circuit of claim 25, wherein said delaying means comprises means for time-shifting both leading and trailing edges of said clock signal by said preset time period "t".

* * * * *